(12) United States Patent
Chou et al.

(10) Patent No.: US 9,125,319 B2
(45) Date of Patent: Sep. 1, 2015

(54) RACK SERVER SYSTEM

(75) Inventors: Le-Sheng Chou, Taoyuan County (TW); Wei-Yi Chu, Taipei (TW); Tien-Jung Chang, Hsinchu County (TW)

(73) Assignee: Quanta Computer Inc., Tao Yuan Shien (TW)

( * ) Notice: Subject to any disclaimer, the term of this patent is extended or adjusted under 35 U.S.C. 154(b) by 621 days.

(21) Appl. No.: 13/364,359

(22) Filed: Feb. 2, 2012

(65) Prior Publication Data
US 2013/0010787 A1    Jan. 10, 2013

(30) Foreign Application Priority Data
Jul. 8, 2011   (TW) .............................. 100124285 A

(51) Int. Cl.
H05K 7/20    (2006.01)
H05K 7/14    (2006.01)

(52) U.S. Cl.
CPC .................................... *H05K 7/1498* (2013.01)

(58) Field of Classification Search
None
See application file for complete search history.

(56) References Cited

U.S. PATENT DOCUMENTS

| | | | |
|---|---|---|---|
| 2005/0050272 A1* | 3/2005 | Behrens et al. | 711/114 |
| 2005/0066106 A1* | 3/2005 | Lee | 710/316 |
| 2005/0138440 A1 | 6/2005 | Barr et al. | |
| 2007/0079008 A1* | 4/2007 | Leibovich et al. | 709/246 |
| 2007/0124474 A1 | 5/2007 | Margulis | |
| 2008/0177912 A1* | 7/2008 | Onda | 710/68 |
| 2008/0313362 A1* | 12/2008 | Takamoto | 710/19 |
| 2009/0077280 A1* | 3/2009 | Anderson et al. | 710/62 |
| 2009/0307476 A1* | 12/2009 | Khatri et al. | 713/2 |
| 2012/0131249 A1* | 5/2012 | Cepulis et al. | 710/269 |
| 2014/0019667 A1* | 1/2014 | Shimada et al. | 710/316 |

FOREIGN PATENT DOCUMENTS

| | | |
|---|---|---|
| CN | 1285055 C | 11/2006 |
| CN | 101001169 A | 7/2007 |
| CN | 102081567 A | 6/2011 |
| JP | 2005-182814 A | 7/2005 |
| JP | 2008-176682 A | 7/2008 |
| JP | 2009517772 A | 4/2009 |
| TW | 200725294 A | 7/2007 |

\* cited by examiner

*Primary Examiner* — Hassan Phillips
*Assistant Examiner* — Gautam Sharma
(74) *Attorney, Agent, or Firm* — Novak Druce Connolly Bove + Quigg LLP

(57) ABSTRACT

A rack server system controlled by a remote controller includes a number of server units and a middle plane board. Each of the server units includes a baseboard management controller (BMC), a server-end connector, and a server-end switch, coupled to the BMC and the server-end connector for regulating communication operation therebetween. The middle plane board includes an integrated connector and a plane-end switch, coupled to the server-end switches of each of the server units and the integrated connector for regulating communication operation thereamong. The remote controller is coupled to the rack server system via one of the integrated connector and the server-end connectors and manages the communication operation of the server units.

20 Claims, 4 Drawing Sheets

RACK SERVER SYSTEM

This application claims the benefit of Taiwan application Serial No. 100124285, filed Jul. 8, 2011, the subject matter of which is incorporated herein by reference.

BACKGROUND OF THE INVENTION

1. Field of the Invention

The invention relates in general to a rack server system, and more particularly to a rack server system in which each server unit of the rack server system has a server-end switch for managing the communication path between the baseboard management controller (BMC) of each server unit and a remote controller.

2. Description of the Related Art

Conventionally, blader server has been widely used in many applications. In general, the blader servers are centralized and disposed in a conventional rack system for increasing the operation convenience to the user. The conventional rack is connected to all blader servers via a switch circuit and manages the operation of data transmission between the blader server and the external network domain. However, how to provide a more flexible network route configuration to the rack system has become a prominent task for the industries.

SUMMARY OF THE INVENTION

The invention is directed to a rack server system controlled by a remote controller. The rack server system includes a number of server units each including a baseboard management controller (BMC), a server-end connector and a server-end switch connected to the BMC and the server-end connector. The rack server system of the invention further includes a middle plane board which includes an integrated connector and an internal switch connected to the integrated connector and the server-end switch. The remote controller is selectively connected to each server unit of the rack server system via one of the integrated connector and the server-end connectors of the server units for controlling each server unit of the server rack system. In comparison to the conventional rack server system, the rack server system of the invention is selectively connected to the remote controller via one of the integrated connector and the server-end connectors of the server units, so as to provide a more flexible network route configuration.

According to an aspect of the present invention, a rack server system controlled by a remote controller is provided. The rack server system includes a number of server units and a middle plane board. Each server unit includes a baseboard management controller (BMC), a server-end connector and a server-end switch. The server-end switch is coupled to the BMC and the server-end connector for regulating the communication operation between the BMC and the server-end connector. The middle plane board includes an integrated connector and an internal switch. The internal switch is coupled to the server-end switch of each server unit and the integrated connector for regulating the communication operation between the server-end switches and the integrated connector. The remote controller is selectively connected to each server unit of the rack server system via one of the integrated connector and the server-end connectors of the server units for controlling each server unit of the server rack system.

According to another aspect of the present invention, a rack server system controlled by a remote controller is provided. The rack server system includes M server units and a middle plane board. Each of the M server units includes N server units, and each of the N server units includes a BMC, a server-end connector and a server-end switch, wherein M and N are natural numbers larger than 1. The server-end switch is coupled to the BMC and the server-end connector for regulating the communication operation between the BMC and the server-end connector. The middle plane board includes M integrated connectors and M internal switches. The M internal switches are coupled to M integrated connectors and M server units, respectively. Each of the M internal switches is coupled to the server-end switch of each of the N server units of a corresponding server unit and a corresponding integrated connector for regulating the communication operation between the BMC of each of the N server units and the corresponding integrated connector. The remote controller is selectively connected to each server unit of the rack server system via one of the M integrated connectors and the server-end connectors of the server units for controlling each server unit of the server rack system.

The above and other aspects of the invention will become better understood with regard to the following detailed description of the preferred but non-limiting embodiment (s). The following description is made with reference to the accompanying drawings.

DETAILED DESCRIPTION OF THE INVENTION

First Embodiment

Figure 1:
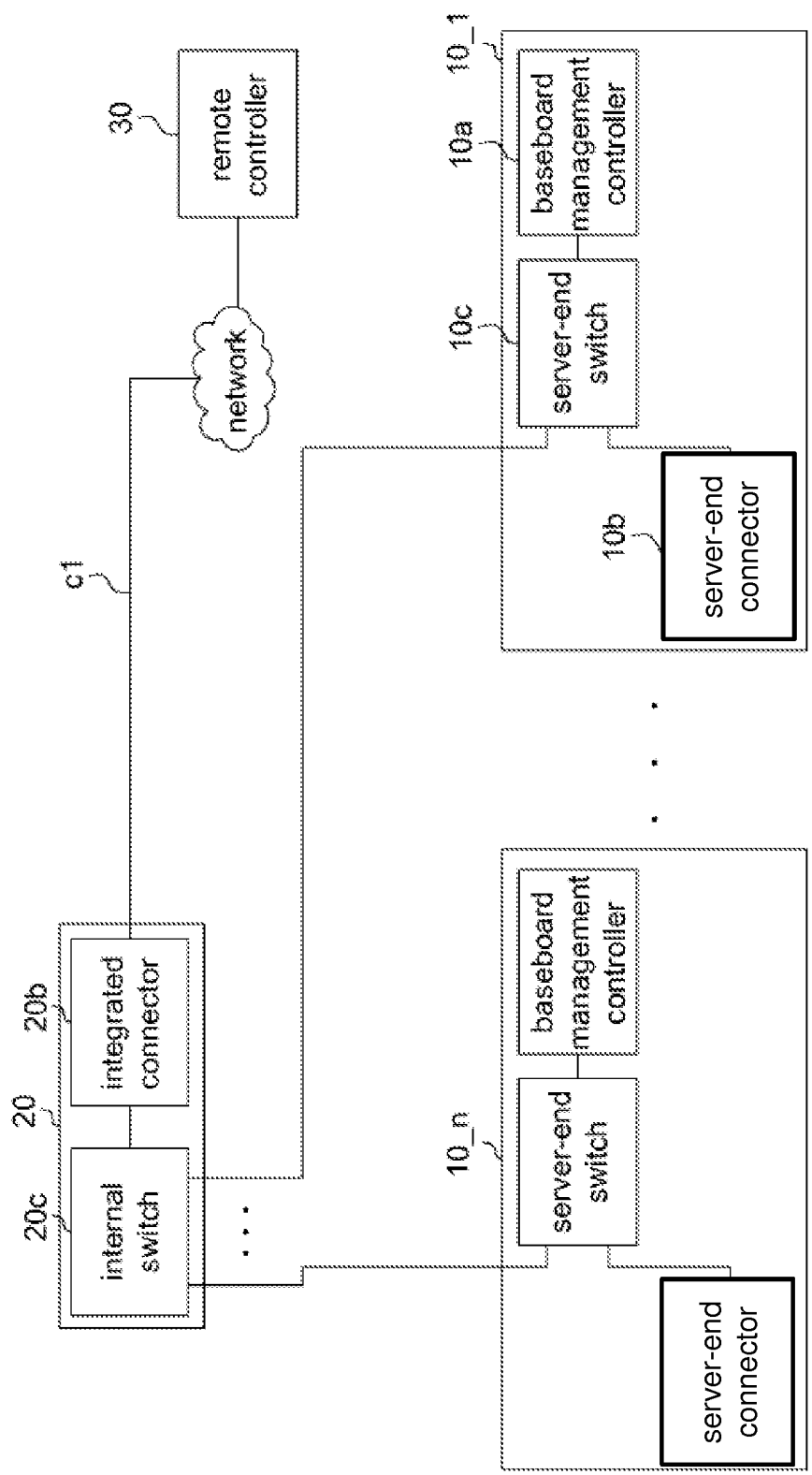
FIG. 1 shows a block diagram of a rack server system according to a first embodiment of the invention.

Referring to FIG. 1, a block diagram of a rack server system according to a first embodiment of the invention is shown. The rack server system is controlled by a remote controller 30 for performing corresponding operations. For example, the remote controller 30 is connected to the rack server system via a network path and communicates with the rack server system according to a server management protocol.

The rack server system includes n server units $10\_1$, $10\_2, \ldots, 10\_n$ and a middle plane board 20, wherein each of the server units $10\_1$ to $10\_n$ is connected to the middle plane board 20 via a corresponding interface. For example, each of the server units $10\_1$ to $10\_n$ having an interposer board structure is connected to the middle plane board 20 via a peripheral component interconnect express (PCI-E) connector.

For example, the circuit structures and operations of the server units $10\_1$ to $10\_n$ substantially are the same, and are elaborated below with an exemplification of the first server unit $10\_1$ of the server units $10\_1$ to $10\_n$.

The server unit $10\_1$ includes a baseboard management controller (BMC) $10a$, a server-end connector $10b$ and a server-end switch $10c$. The server-end switch $10c$ such as has a number of connection ports, and two of the connection ports are coupled to the BMC $10a$ and the server-end connector $10b$, respectively. The server-end switch $10c$ further correspondingly regulates the communication operation between the BMC 10a and the server-end connector 10b for correspondingly managing the operation of data transmission between the BMC 10a and the server-end connector 10b. For example, the server-end switch 10c of the server unit 10_1 communicates with the BMC 10a via a reduced media independent interface (RMII), and the server-end switch 10c communicates with the server-end connector 10b according to a local area network (LAN) communication protocol.

The middle plane board 20 includes an integrated connector 20b and an internal switch 20c. The internal switch 20c includes n connection ports respectively coupled to the server-end switch 10c of the n server units 10_1 to 10_n. The internal switch 20c further includes a connection port coupled to the integrated connector 20b. The internal switch 20c regulates the communication operation between the BMC 10a of each of the server units 10_1 to 10_n and the integrated connector 20b for correspondingly managing the operation of data transmission between the BMC 10a of each of the server units 10_1 to 10_n and the integrated connector 20b.

For example, the server-end switch 10c of each of the server units 10_1 to 10_n communicates with the internal switch 20c according to an LAN communication protocol. In an example, the interposer board structure of each of the server units 10_1 to 10_n further has a bus connector connected to a PCI-E connector, and the server-end switch 10c of each of the server units 10_1 to 10_n is connected to the interposer board via a corresponding bus. For example, the bus connector is such as a serial advanced technology attachment (SATA) connector, and the bus is an SATA bus.

The remote controller 30 is selectively connected to each of the server units 10_1 to 10_n of the rack server system via one of the integrated connector 20b and the server-end connector 10b of each of the server units 10_1 to 10_n for communicating with the BMC 10a of each of the server units 10_1 to 10_n for controlling the server units 10_1 to 10_n.

In an embodiment, the remote controller 30 is connected to the integrated connector 20b via a communication link C1. Through the switching operation of the internal switch 20c, the remote controller 30 can communicate with the BMC 10a of each of the server units 10_1 to 10_n for controlling the server units.

Figure 2:
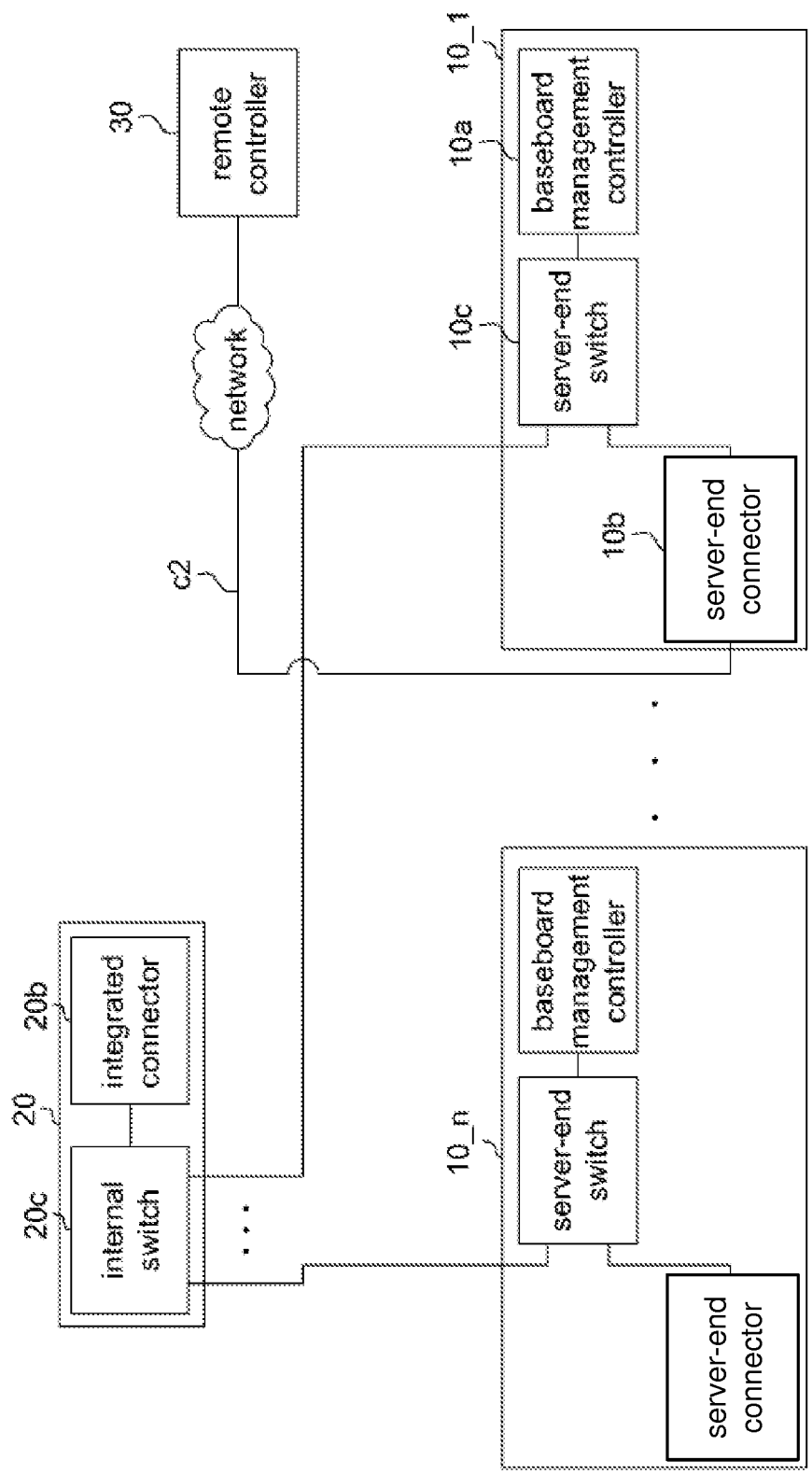
FIG. 2 shows another block diagram of a rack server system according to a first embodiment of the invention.

Referring to FIG. 2, another block diagram of a rack server system according to a first embodiment of the invention is shown. In another embodiment, the remote controller 30 is connected to the server-end connector 10b of one of the server units 10_1 to 10_n via a communication link C2. For example, the remote controller 30 is connected to the server-end connector 10b of the server unit 10_1 via the communication link C2. Through the switching operation of the server-end switch 10c of the server unit 10_1, the remote controller 30 can communicate with the BMC 10a of the server unit 10_1 for controlling the server units. In addition, through the switching operation between the server-end switch 10c and the internal switch 20c, the remote controller 30 can communicate with the BMC 10a of the remaining (n−1) server unit 10_2-10_n via corresponding communication links for controlling the server units.

In other words, despite the rack server system is connected to the remote controller 30 via the server-end connector 10b of the server unit 10_1, the remote controller 30 still can communicate with the remaining server units 10_2-10_n of the rack server system through the switching operation between the server-end switch 10c of the server unit and the internal switch 20c for controlling the server units.

In the present embodiment of the invention, the remote controller 30 is connected to the server-end connector 10b of the server unit 10_1 via a communication link C2. However, the rack server system of the present embodiment of the invention is not limited to the above exemplification. In other examples, the remote controller 30 can also be connected via the server-end connector of any of the server units 10_2-10_n for controlling all of the server units 10_1 to 10_n.

To summarize, through the switching operation between the server-end switch 10c of each of the server units 10_1 to 10_n and the internal switch 20c, all connectors (including the integrated connector 20b and the server-end connector 10b of each of the server units 10_1 to 10_n) of the rack server system substantially provide the same network route function, and the user can select one of the connectors for connecting the remote controller 30.

In another operating example, since all the connectors of the rack server system substantially provide the same network route function, the user can select any connector of the rack server system to be serially connected to any connector of another rack server system for correspondingly increasing the number of server units of the rack server system. Besides, all connection ports of the two rack server systems substantially provide the same network route function.

In the present embodiment of the invention, the middle plane board 20 of the rack server system includes an internal switch 20c and an integrated connector 20b for correspondingly connecting n server unit 10_1 to 10_n. However, the rack server system of the present embodiment of the invention is not limited to the above exemplification. In other examples, the middle plane board 20' of the rack server system may further include m internal switches 20c_1, 20c_2, . . . , 20c_m and m integrated connectors 20b_1, 20b_2, . . . , 20b_m as indicated in FIG. 2.

The m internal switches 20c_1 to 20c_m are coupled to m server unit groups 100_1, 100_2, . . . , 100_m respectively for switching signals. The m integrated connectors 20b_1 to 20b_m are coupled to the m internal switches 20c_1 to 20c_m respectively, and are used as a network connection port of the rack server system. Each of the m server unit groups 100_1 to 100_m such as includes n server units 10_11 to 10_1n, 10_21 to 10_2n, . . . , 10_m1 to 10_mn. In other words, the rack server system illustrated in FIG. 2 such as has m×n server units.

Second Embodiment

Figure 3:
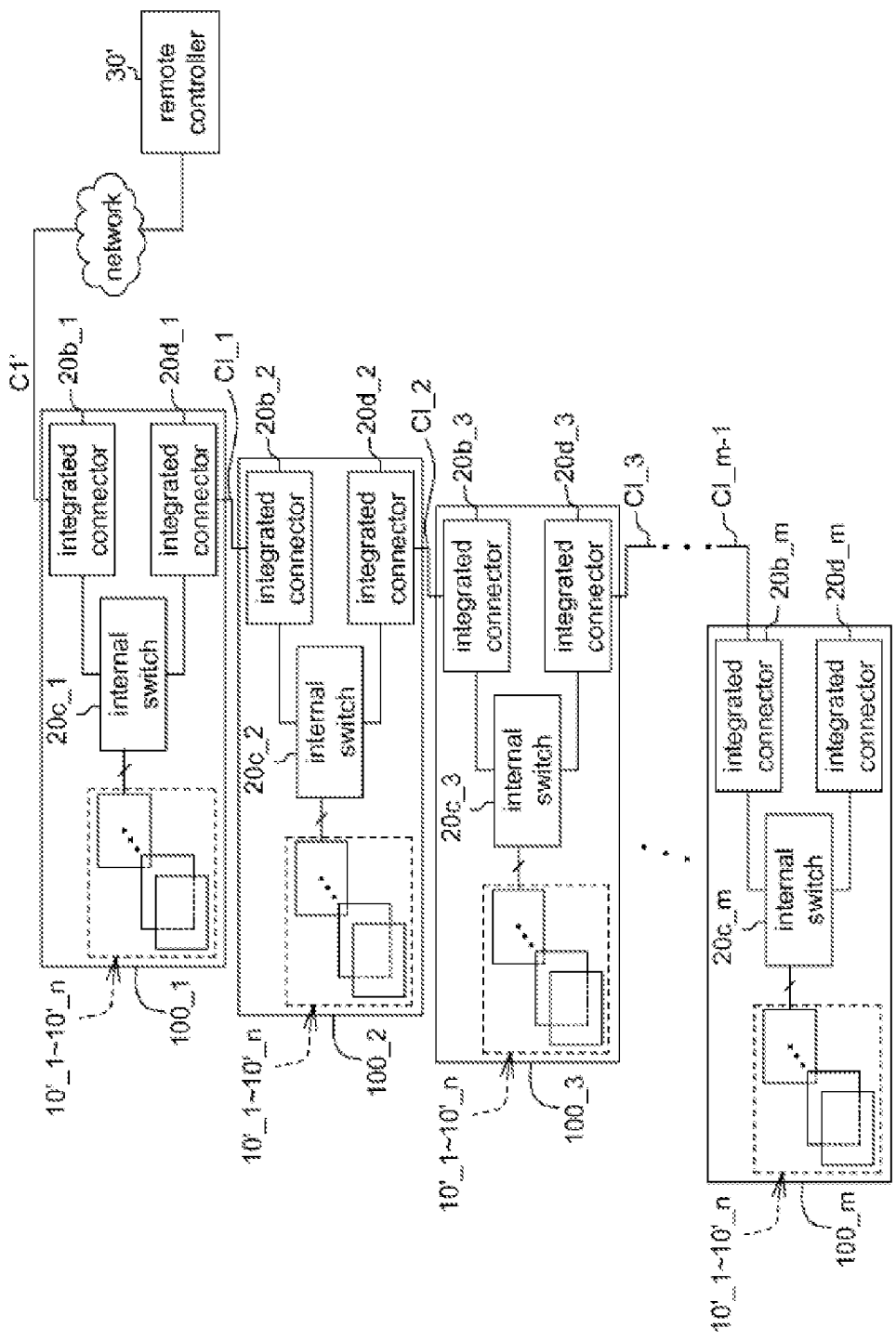
FIG. 3 shows a block diagram of a rack server system according to a second embodiment of the invention.

Referring to FIG. 3, a block diagram of a rack server system according to a second embodiment of the invention is shown. The rack server system of the present embodiment of the invention is different from the rack server system of the first embodiment mainly in that the rack server system of the present embodiment of the invention includes m server unit groups 100_1, 100_2, . . . , 100_m, and the circuit structure of each of the m server unit groups 100_1 to 100_m is similar to that of the rack server system of the first embodiment. Each of the m server unit groups 100_1 to 100_m includes n server units, an internal switch and an integrated connector, wherein m is a natural number larger than 1.

For example, the circuit structures of the m server unit groups 100_1 to 100_m are substantially the same, and the first server unit group 100_1 is used as an exemplification for elaborating the m server unit groups 100_1 to 100_m.

Let the first server unit group 100_1 be taken for example. The first server unit group 100_1 includes n server units 10'_1 to 10'_n, an internal switch 20c_1, and two integrated connectors 20b_1 and 20d_1. The circuit structure of each of the server units 10'_1 to 10'_n is substantially the same with that of the server unit 10_1 of FIG. 1, and each of the server units 10'_1 to 10'_n includes a BMC, a server-end switch and a server-end connector.

The internal switch 20c_1 is coupled to each of the server units 10'_1 to 10'_n and the integrated connectors 20b_1 and 20d_1 for regulating the communication operation between the BMC of each of the server units 10'_1 to 10'_n and the integrated connectors 20b_1 and 20d_1 for correspondingly managing the operation of data transmission between the BMC of each of the server units 10'_1 to 10'_n and the integrated connectors 20b_1 and 20d_1.

The integrated connector 20b_1 is connected to the remote controller 30' via a communication link C1'. Through the switching operation of the internal switch 20c_1, the remote controller 30' can communicate with the BMC of each of the server units 10'_1 to 10'_n of the first server unit group 100_1 for controlling the server units.

The integrated connector 20d_1 is connected to the integrated connector 20b_2 of the second server unit group 100_2 via an internal communication link CI_1. For example, the integrated connectors 20d_2, 20d_3, . . . , and 20d_m−1 of the second, the third, to the (m−1)-th server unit group 100_2, 100_3, . . . , 100_m−1 are serially connected to the integrated connectors 20b_3, 20b_4, . . . , 20b_m of the server unit groups 100_3, 100_4, . . . , 100_m. In other words, the m server unit groups 100_1 to 100_m are correspondingly connected in serial via corresponding internal communication links CI_1, CI_2, . . . , CI_m−1, and the server unit groups 100_1 to 100_m are further connected to the remote controller 30' via the communication link C1'. In other words, the rack server system of the present embodiment of the invention completes the network route of all of the m×n server units with only one communication link C1' and (m−1) internal communication links CI_1 to CI_m−1.

To summarize, through the communication link C1' and the internal communication links CI_1 to CI_m−1, the m server unit groups 100_1 to 100_m can be mutually connected in serial and connected to the remote controller 30'. Besides, through the switching operation of the internal switch 20c_1 to 20c_m of the m server unit groups 100_1 to 100_m, the remote controller 30' correspondingly communicates with the BMC of all server unit 10'_1 to 10'_n of each of the m server unit groups 100_1 to 100_m for controlling each server unit of the server rack system.

Figure 4:
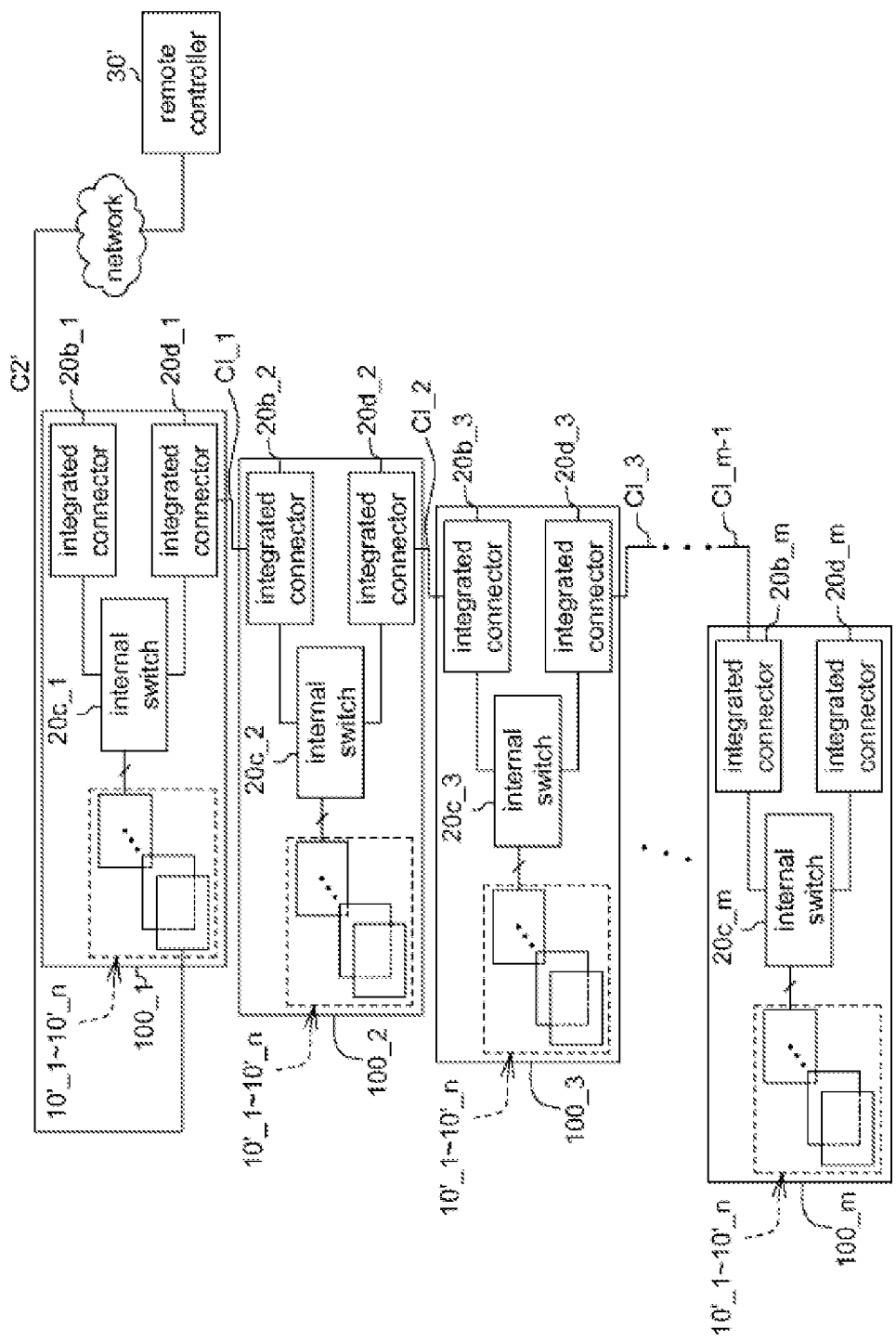
FIG. 4 shows another block diagram of a rack server system according to a second embodiment of the invention.

Referring to FIG. 4, another block diagram of a rack server system according to a second embodiment of the invention is shown. In an example, each of the m server unit groups 100_1 to 100_m can be connected to the remote controller 30' via the server-end connector of any of the server units. For example, a communication link C2' is established between the server-end connector of the first server unit 10'_1 of the first server unit group 100_1 and the remote controller 30', and the remote controller 30' communicates with the BMC of the first server unit group 10'_1 via the communication link C2' for controlling each server unit of the server rack system.

In addition, the remote controller 30' communicates with the BMC of the remaining server units 10'_2-10'_n of the first server unit group 100_1 such as through the switching operation of the server-end switch of the first server unit group 10'_1 for controlling each server unit of the server rack system, and further communicates with the BMC of all server units of the m server unit groups 100_1 to 100_m through the switching operation of the internal switch 20c_1 to 20c_m for controlling each server unit of the server rack system.

The rack server system controlled by a remote controller disclosed in the above embodiments of the invention includes a number of server units each including a BMC, a server-end connector and a server-end switch connected to the BMC and the server-end connector. The rack server system of the present embodiment further includes a middle plane board, which includes an integrated connector and an internal switch connected to the integrated connector and the server-end switch. The remote controller is selectively connected to each server unit of the rack server system via one of the integrated connector and the server-end connectors of the server units for controlling each server unit of the server rack system. In comparison to the conventional rack server system, the rack server system of the above embodiments of the invention is selectively connected to the remote controller via one of the integrated connector or the server-end connectors, so as to provide a more flexible network route configuration.

Besides, each server unit of the rack server system of the above embodiments of the invention is selectively connected to the middle plane board with a corresponding connection interface (such as a PCI-E or an SATA connector) via one of the interposer board and the bus connector. Moreover, the rack server system of a part of the embodiments of the invention can complete the network route of all of the m×n server units with only one communication link and (m−1) internal communication links. In comparison to the conventional rack server system, the rack server system of the above embodiments of the invention, with the disposition of the above connection interfaces, further has the advantages of reducing the required number of network routes and improving the management of the rack server system.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A rack server system controlled by a remote controller located on a network, wherein the rack server system comprises:
   one or more server units, each comprising:
      a baseboard management controller (BMC);
      a server-end connector; and
      a server-end switch coupled to the BMC and the server-end connector for regulating the communication operation between the BMC and the server-end connector; and
   a middle plane board, comprising:
      an integrated connector coupled to the network; and
      an internal switch coupled to the server-end switch of each of the server units and the integrated connector for regulating the communication operation between the BMC of each of the server units and the integrated connector;
   wherein the server-end connector of at least one server unit from the one or more server units is coupled to the network bypassing the middle plane board.

2. The rack server system according to claim 1, wherein each of the server units further comprises:
   an interposer board coupled to the server-end switch and connected to the internal switch via an interposer board interface.

3. The rack server system according to claim 2, wherein the interposer board further comprises a bus connector connected to the interposer board interface, and each server-end switch is coupled to the interposer board via a bus.

4. The rack server system according to claim 1, wherein the remote controller communicates with the BMC of each of the server units via a server management protocol.

5. The rack server system according to claim 1, wherein the server-end switch of each of the server units communicates with the BMC via a reduced media independent interface (RMII).

6. The rack server system according to claim 1, wherein the server-end switch of each of the server units communicates with the server-end connector according to a local area network (LAN) communication protocol.

7. The rack server system according to claim 1, wherein the server-end switch of each of the server units communicates with the internal switch according to a local area network (LAN) communication protocol.

8. A rack server system controlled by a remote controller located on a network, wherein the rack server system comprises:
 M server unit groups, each comprising N server units, wherein M and N are natural numbers larger than 1, and each of the N server units comprises:
  a baseboard management controller (BMC);
  a server-end connector; and
  a server-end switch coupled to the BMC and the server-end connector for regulating the communication operation between the BMC and the server-end connector; and
 M middle plane boards, each associated with one of the M server unit groups, and each comprising:
  at least one integrated connector coupled to one of the network or an integrated connector for another of the M middle plane boards; and
  an internal switch coupled to the at least one integrated connector and the N server units, wherein the internal switch is coupled to the server-end switch of each of the N server units for regulating the communication operation between the BMC of each of the N server units and the at least one integrated connector;
 wherein the server-end connector of at least one server unit is coupled to the network bypassing the middle plane board.

9. The rack server system according to claim 8, wherein each of the N server units in each of the M server unit groups further comprises:
 an interposer board coupled to the corresponding server-end switch and coupled to the internal switch of the corresponding one of the M server unit groups via an interposer board interface.

10. The rack server system according to claim 9, wherein the interposer board further comprises a bus connector connected to the interposer board interface, and the corresponding server-end switch is coupled to the interposer board via a bus.

11. The rack server system according to claim 8, wherein the remote controller communicates with the BMC of each of the N server units of the M server unit groups via a server management protocol.

12. The rack server system according to claim 8, wherein the server-end switch of each of the N server units of the M server groups communicates with the corresponding BMC via a reduced media independent interface (RMII).

13. The rack server system according to claim 8, wherein the server-end switch of each of the N server units of the M server groups communicates with the corresponding server-end connector according to a local area network (LAN) communication protocol.

14. The rack server system according to claim 8, wherein the server-end switch of each of the N server units of the M server groups communicates with the corresponding internal switch according to an LAN communication protocol.

15. The rack server system of according to claim 8, wherein each of the at least one integrated connector comprises a first integrated connector and a second integrated connector, and wherein the M server unit groups are coupled in a cascade arrangement to the network using the first integrated connector and the second integrated connector.

16. A system controlled by a remote computing device located on a network, wherein the system comprises at least one computing device group comprising:
 one or more local computing devices, each comprising:
  a management controller (MC);
  an end connector; and
  an end switch coupled to the MC and the end connector for managing communications between the MC and the end connector; and
 an intermediate component, comprising:
  at least one integrated connector coupled to the network; and
  an internal switch coupled to the end switch of each of the local computing devices and the integrated connector for managing communications between the MC of each of the local computing device and the at least one integrated connector;
 wherein the server-end connector of at least one local computing device from the one or more local computing devices is coupled to the network bypassing the intermediate component.

17. The system according to claim 16, wherein the at least one computing device group comprises a plurality of computing device groups.

18. The system of according to claim 17, wherein the at least one integrated connector for each of the plurality of computing device groups comprises a first integrated connector and a second integrated connector, and wherein the plurality of computing device groups are coupled in a cascade arrangement to the network using the first integrated connector and the second integrated connector.

19. The system according to claim 16, wherein each local computing devices further comprises:
 an interposer board coupled to the corresponding end switch and coupled to the internal switch via an interposer board interface.

20. The system according to claim 19, wherein the interposer board further comprises a bus connector connected to the interposer board interface, and the corresponding server-end switch is coupled to the interposer board via a bus.

* * * * *